(12) United States Patent
Park et al.

(10) Patent No.: US 9,006,742 B2
(45) Date of Patent: Apr. 14, 2015

(54) THIN FILM TRANSISTOR ARRAY PANEL

(71) Applicant: Samsung Display Co., Ltd., Yongin (KR)

(72) Inventors: Jeong Min Park, Seoul (KR); Dong-Won Woo, Asan-si (KR); Je Hyeong Park, Hwaseong-si (KR); Sang Gab Kim, Seoul (KR); Jung-Soo Lee, Seoul (KR); Ji-Hyun Kim, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/952,059

(22) Filed: Jul. 26, 2013

(65) Prior Publication Data

US 2013/0306974 A1 Nov. 21, 2013

Related U.S. Application Data

(62) Division of application No. 13/310,005, filed on Dec. 2, 2011, now Pat. No. 8,518,731.

(30) Foreign Application Priority Data

Feb. 7, 2011 (KR) .................. 10-2011-0010745

(51) Int. Cl.
*H01L 29/786* (2006.01)
*H01L 27/12* (2006.01)

(52) U.S. Cl.
CPC ........ *H01L 29/786* (2013.01); *H01L 29/78645* (2013.01); *H01L 27/124* (2013.01); *H01L 27/1259* (2013.01)

(58) Field of Classification Search
CPC . H01L 27/124; H01L 27/786; H01L 27/1259; H01L 29/786; H01L 29/7869; H01L 29/78645
USPC ........................................ 257/59, 72
See application file for complete search history.

(56) References Cited

U.S. PATENT DOCUMENTS 7,105,896 B2 * 9/2006 Tanaka et al. ............... 257/347
7,250,991 B2 * 7/2007 Nagata et al. ............... 349/38

(Continued)

FOREIGN PATENT DOCUMENTS

JP  2009-251174  10/2009
KR  10-0358700   10/2002

(Continued)

OTHER PUBLICATIONS

Non-Final Office Action of U.S. Appl. No. 13/310,005 dated Jan. 17, 2013.

(Continued)

*Primary Examiner* — Nikolay Yushin
(74) *Attorney, Agent, or Firm* — H. C. Park & Associates, PLC

(57) ABSTRACT

A manufacturing method of a thin film transistor array panel includes: simultaneously forming a gate conductor and a first electrode on a substrate, using a non-peroxide-based etchant; forming a gate insulating layer on the gate conductor and the first electrode; forming a semiconductor, a source electrode, and a drain electrode on the gate insulating layer; forming a passivation layer on the semiconductor, the source electrode, and the drain electrode; and forming a second electrode layer on the passivation layer.

7 Claims, 26 Drawing Sheets

(56) References Cited

U.S. PATENT DOCUMENTS

| | | | |
|---|---|---|---|
| 7,480,015 B2 | 1/2009 | Kim et al. | |
| 7,483,087 B2 | 1/2009 | Jin et al. | |
| 7,495,715 B2 | 2/2009 | Um et al. | |
| 2004/0169991 A1* | 9/2004 | Nagata et al. | 361/301.1 |
| 2005/0056839 A1* | 3/2005 | Tanaka et al. | 257/59 |
| 2006/0192906 A1 | 8/2006 | Ryu et al. | |

FOREIGN PATENT DOCUMENTS

| | | |
|---|---|---|
| KR | 10-2006-0131018 | 12/2006 |
| KR | 10-2007-0052173 | 5/2007 |
| KR | 10-2007-0079377 | 8/2007 |
| KR | 10-2007-0087293 | 8/2007 |
| KR | 10-2008-0050679 | 6/2008 |
| KR | 10-2008-0071001 | 8/2008 |

OTHER PUBLICATIONS

Notice of Allowance of U.S. Appl. No. 13/310,005 dated May 20, 2013.

* cited by examiner

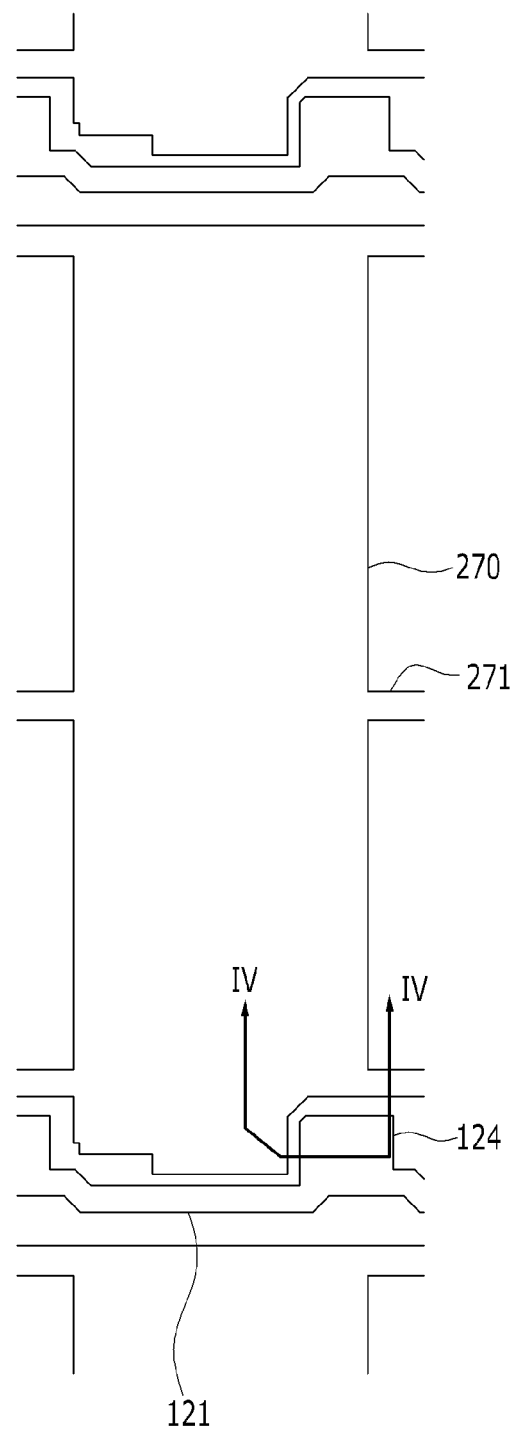

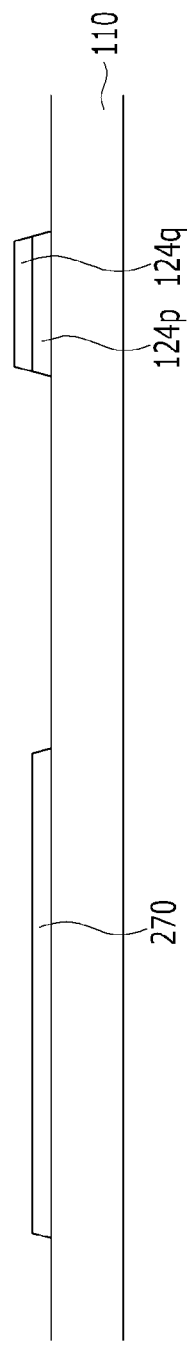

THIN FILM TRANSISTOR ARRAY PANEL

CROSS-REFERENCE TO RELATED APPLICATION

This application is a divisional of U.S. patent application Ser. No. 13/310,005, filed on Dec. 2, 2011, and claims priority to and the benefit of Korean Patent Application No. 10-2011-0010745 filed on Feb. 7, 2011, which is hereby incorporated by reference for all purposes as if fully set forth herein.

BACKGROUND OF THE INVENTION

1. Field of the Invention

The present invention relates to a thin film transistor array panel and a method of manufacturing the same.

2. Discussion of the Background

Liquid crystal displays (LCDs) are one of the most widely used type of flat panel display. Liquid crystal displays form images by applying voltages to field generating electrodes, to generate an electric field in a liquid crystal (LC) layer. The electric field determines the orientations of LC molecules therein, to adjust polarization of incident light.

While liquid crystal displays are light-weight and thin, the lateral visibility thereof is lower than the front visibility. As such, various liquid crystal arrangements and driving methods have been developed to solve these drawbacks. To realize a wide viewing angle, the arrangement of field generating electrodes on one substrate has been spotlighted.

However, in the case of a thin film transistor array panel used in a liquid crystal display, two field generating electrodes are formed in the thin film transistor array panel, such that the manufacturing process is complicated and the manufacturing costs may be increased.

The above information disclosed in this Background section is only for enhancement of understanding of the background of the invention, and therefore, it may contain information that does not constitute prior art.

SUMMARY OF THE INVENTION

Exemplary embodiments of the present invention provide a simplified method of manufacturing a thin film transistor array panel display including two field generating electrodes formed on one substrate, and a liquid crystal display including the same.

Additional features of the invention will be set forth in the description which follows, and in part will be apparent from the description, or may be learned by practice of the invention.

A manufacturing method of a thin film transistor array panel, according to an exemplary embodiment of the present invention, includes: simultaneously forming a gate conductor and a first electrode on a substrate, using a non-peroxide-based etchant; forming a gate insulating layer on the gate conductor and the first electrode; forming a semiconductor, a source electrode, and a drain electrode on the gate insulating layer; forming a passivation layer on the semiconductor, the source electrode, and the drain electrode; and forming a second electrode layer on the passivation layer.

The simultaneous forming of the gate conductor and the first electrode layer may include: sequentially depositing a first metal layer and a second metal layer on a substrate; forming a first photosensitive film pattern on the second metal layer; simultaneously etching the first metal layer and the second metal layer with a first non-peroxide-based etchant, using the first photosensitive film pattern as a and; removing a portion of the first photosensitive film pattern to form a second photosensitive film pattern; and etching the second metal layer with a second non-peroxide-based etchant, using the second photosensitive film pattern as an etching mask.

A thin film transistor array panel, according to an exemplary embodiment of the present invention, includes: a gate conductor and a first electrode disposed on a substrate; a gate insulating layer disposed on the gate conductor and the first electrode; a semiconductor disposed on the gate insulating layer; a source electrode and a drain electrode disposed on the semiconductor; a passivation layer disposed on the source electrode and the drain electrode; and a second electrode disposed on the passivation layer. The gate conductor includes a lower layer and an upper layer, and the lower layer of the gate conductor is made of the same material as the first electrode.

In a thin film transistor array panel, according to an exemplary embodiment of the present invention, the gate conductor and one of the field generation electrodes are formed from the same layer of material, using a single mask. As such, the manufacturing process of the thin film transistor array panel may be simplified. Also, when forming the gate conductor and the field generating electrode using one mask and a predetermined etchant, a predetermined layer is effectively etched in the desired step, thereby simplifying the manufacturing process.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 3, FIG. 6, FIG. 8 are layout views sequentially showing a manufacturing method of a thin film transistor array panel, according to an exemplary embodiment of the present invention.

FIG. 4 is a cross-sectional view of the thin film transistor array panel of FIG. 3, taken along the line IV-IV.

DETAILED DESCRIPTION OF THE ILLUSTRATED EMBODIMENTS

Figure 1:
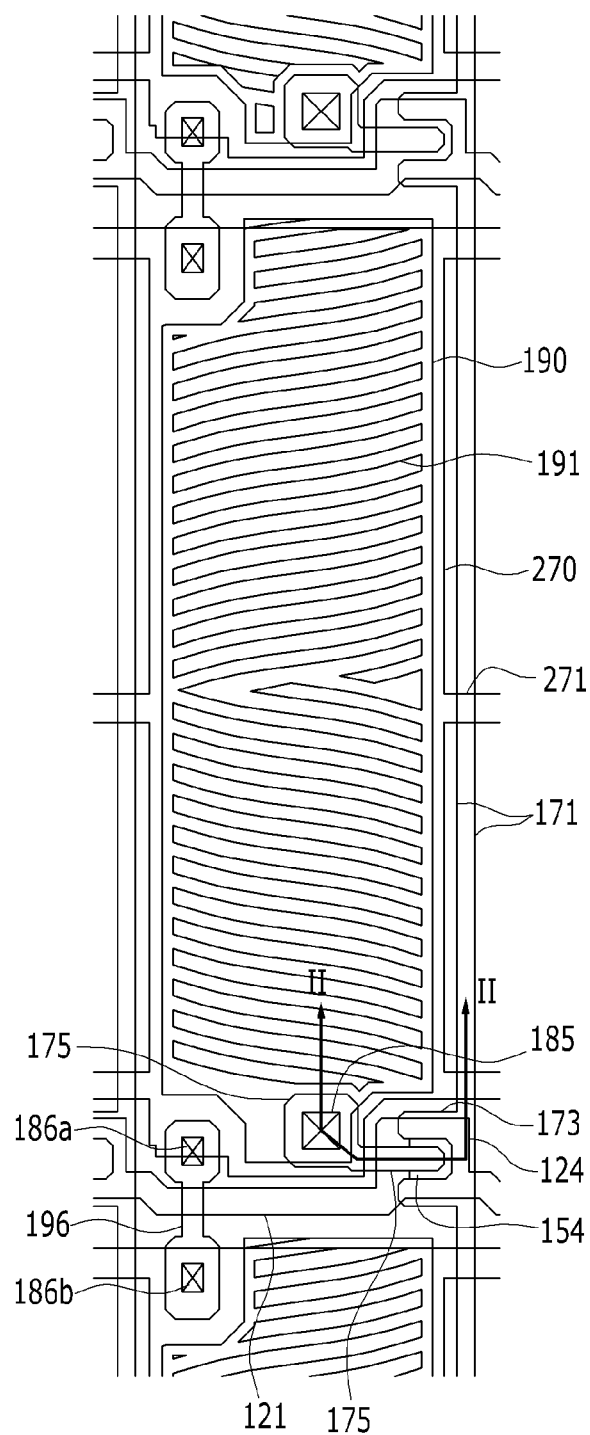
FIG. 1 is a layout view of a thin film transistor array panel, according to an exemplary embodiment of the present invention.

The present invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
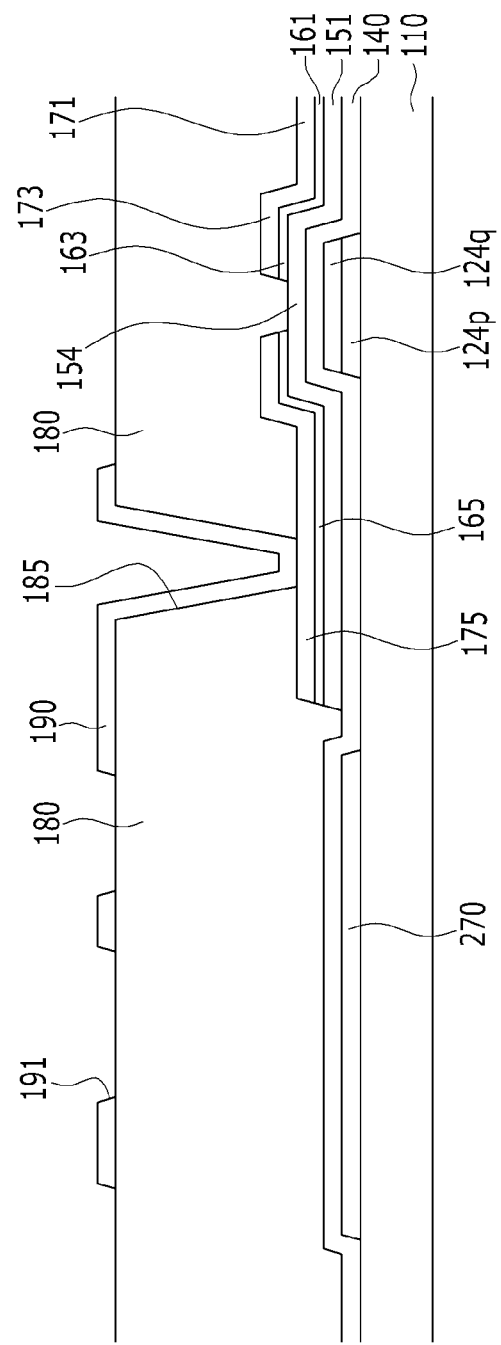
FIG. 2 is a cross-sectional view of the thin film transistor array panel of FIG. 1, taken along the line II-II.

FIG. 1 is a layout view of a thin film transistor array panel, according to an exemplary embodiment of the present invention, and FIG. 2 is a cross-sectional view of the thin film transistor array panel of FIG. 1, taken along the line II-II. Referring to FIG. 1 and FIG. 2, the thin film transistor array panel includes a gate conductor, including a gate line 121 and a reference electrode 270 formed on an insulation substrate 110 made of a transparent glass or plastic.

The gate lines 121 transmit gate signals and extend in a transverse direction. Each of gate lines 121 includes a plurality of gate electrodes 124 that protrude upwards and an end portion (not shown) for connection with another layer or an external driving circuit. A gate driving circuit (not shown) that generates a gate signal may be mounted on a flexible printed circuit film (not shown) that is attached to the insulation substrate 110, directly mounted on the insulation substrate 110, or integrated with the insulation substrate 110. When the gate driving circuit is integrated with the substrate 110, the gate line 121 is directly connected to the circuit.

The gate conductor (121 and 124) is a dual-layer structure including a lower layer 124p and an upper layer 124q. The lower layer 124p is formed from the same layer of material as the reference electrode 270. For example, the lower layer 124p may include a transparent conductive material, such as poly-crystalline, mono-crystalline, or amorphous indium tin oxide (ITO) or indium zinc oxide (IZO). The upper layer 124q may include a metal having a low resistivity, such as copper (Cu) or a copper alloy, to reduce a signal delay or a voltage drop. However, the upper layer 124q may be made of aluminum (Al), an aluminum alloy, silver (Ag), a silver alloy, molybdenum (Mo), a molybdenum alloy, chromium (Cr), tantalum (Ta), or titanium (Ti).

The reference electrode 270 is generally planar and covers a pixel area. The reference electrode 270 includes a connection 271 to connect with a reference electrode 270 disposed in an adjacent pixel area. The reference electrode 270 is made of a transparent conductive material, such as poly-crystalline, mono-crystalline, or amorphous ITO or IZO. The gate conductor (121 and 124) and the reference electrode 270 are simultaneously formed using one exposure mask.

A gate insulating layer 140 made of silicon nitride ($SiN_x$) or silicon oxide ($SiO_x$) is formed on the gate conductor (121 and 124) and the reference electrode 270. The gate insulating layer 140 may have a multilayer structure, including at least two insulating layers having different physical properties.

A plurality of semiconductor stripes 151 made of hydrogenated amorphous silicon (a-Si) or polysilicon are formed on the gate insulating layer 140. The semiconductor stripes 151 mainly extend in a longitudinal direction and include a plurality of projections 154 that extend toward the gate electrodes 124.

A plurality of ohmic contact stripes and islands 161 and 165 are formed on the semiconductor stripes 151. The ohmic contacts 161 and 165 may be made of a material, such as n+ hydrogenated amorphous silicon, in which an n-type impurity, such as phosphorus, is doped at a high concentration, or may include a silicide. The ohmic contact stripes 161 have a plurality of projections 163. The projections 163 and the ohmic contact islands 165 are formed in pairs on the projections 154 of the semiconductor stripes 151.

A plurality of data lines 171 and a plurality of drain electrodes 175 are formed on the ohmic contacts 161 and 165. The data lines 171 transmit the data signals and mainly extend in the longitudinal direction, thereby intersecting the gate lines 121. Each data line 171 includes source electrodes 173 that extend toward the gate electrode 124, and a wide end (not shown) for connecting to other layers or an external driving circuit.

Each drain electrode 175 is separated from the data line 171 and faces the source electrode 173 with respect to the gate electrode 124. The drain electrode 175 includes a bar-shaped end portion and an extension having a wide area. The bar-shaped end portion is partially enclosed by the curved source electrode 173.

The gate electrode 124, the source electrode 173, and the drain electrode 175 form a thin film transistor (TFT), along with the projections 154 of the semiconductor 151. A channel of the thin film transistor is formed in the projection 154, between the source electrode 173 and the drain electrode 175.

The data lines 171 and the drain electrodes 175 are generally made of a refractory metal, such as molybdenum, chromium, tantalum, and titanium, or alloys thereof, and can have a multilayer structure, including a refractory metal film (not shown) and a low-resistance conductive layer (not shown). Examples of the multilayer structure can include a dual layer of a chromium or molybdenum (alloy) lower film and an aluminum (alloy) upper film, and a triple layer of a molybdenum (alloy) lower film, an aluminum (alloy) intermediate layer, and a molybdenum (alloy) upper film. Also, the data lines 171 and the drain electrodes 175 can be made of various other metals or conductors.

The ohmic contact stripes and islands 161 and 165 are disposed between the underlying semiconductor stripes 151 and the overlying data lines 171 and drain electrodes 175, to lower the contact resistance therebetween. A passivation layer 180 is formed on the data lines 171, the drain electrodes 175, and the exposed portions of the semiconductor stripes 151. The passivation layer 180 is made of an inorganic insulator, an organic insulation material, or the like, and can have a planarized surface. Examples of an inorganic insulator can be silicon nitride and silicon oxide. The organic insulator can have photosensitivity, and may generally have a dielectric constant that is not greater than about 4.0. In this respect, the passivation layer 180 may also have a dual-layered structure including a lower inorganic layer and an upper organic layer, so that it may not damage the exposed portion of the semiconductor stripe 151, while still exhibiting the excellent insulation characteristics of the organic layer.

The passivation layer 180 has a first contact hole 185 exposing the drain electrode 175. The passivation layer 180 and the gate insulating layer 140 have a plurality of second and third contact holes 186a and 186b exposing a portion of the reference electrode 270.

A plurality of pixel electrodes 190 and a plurality of first contact assistants 196 are formed on the passivation layer 180. They may be made of a transparent conductive material, such as mono-crystalline, poly-crystalline, or amorphous ITO or IZO, or of a reflective metal, such as aluminum, silver, chromium, or alloys thereof. The first contact assistants 196 connect the reference electrodes 270 through the second contact hole 186a and the third contact hole 186b of adjacent pixels.

The pixel electrode 190 includes a plurality of branch electrodes 191. The branch electrodes 191 extend approximately parallel to the gate line 121, and may be inclined with an angle of about 5° to about 20° with respect to the gate line 121.

Each pixel electrode 191 is physically and electrically connected with the drain electrode 175 through the contact hole 185, and receives a data voltage from the drain electrode 175. The pixel electrode 191 supplied with the data voltages generates an electric field along with the reference electrode 270 that receives a reference voltage, to thereby determine a direction of the liquid crystal molecules (not shown) of a liquid crystal layer disposed between the two electrodes 191 and 270. The polarization of light transmitted through the liquid crystal layer can be varied, according to the orientation of the liquid crystal molecules.

The lower layer of the gate conductor and the reference electrode are formed on the same layer (directly on the substrate 110), according to an exemplary embodiment of the present invention. The gate conductor and the reference electrode are simultaneously formed, such that the manufacturing process of the thin film transistor array panel may be simplified.

Figure 5A:
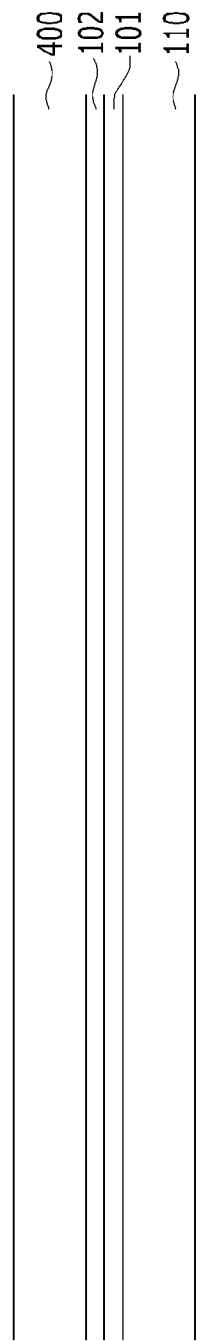
FIG. 5A to FIG. 5E are cross-sectional views sequentially showing a manufacturing method of a thin film transistor array panel of FIG. 3 and FIG. 4.
Figure 5B:
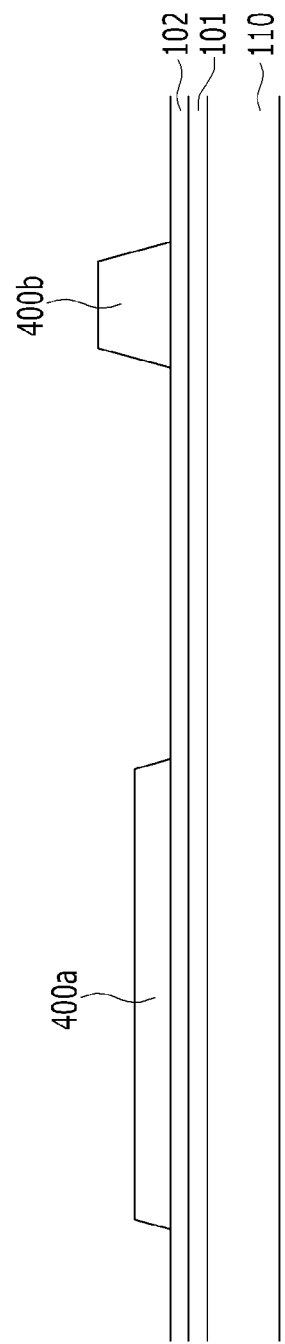
Figure 5C:
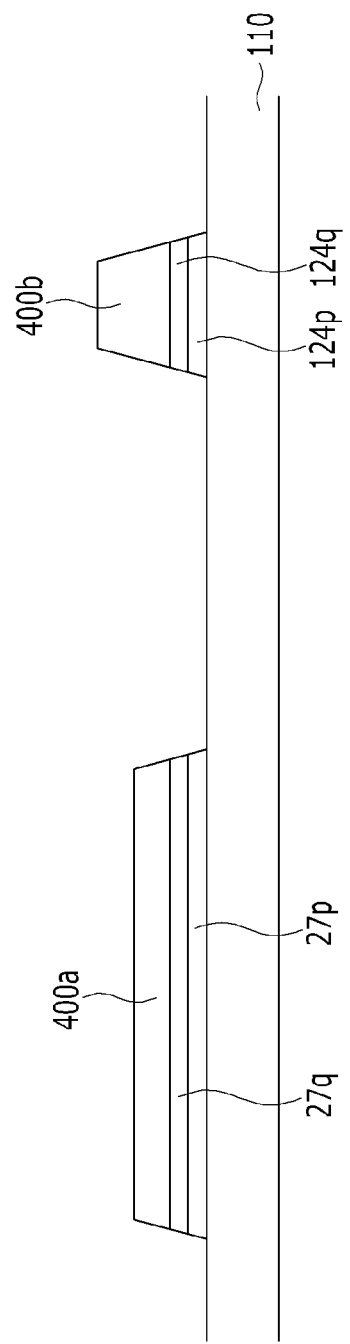
Figure 5D:
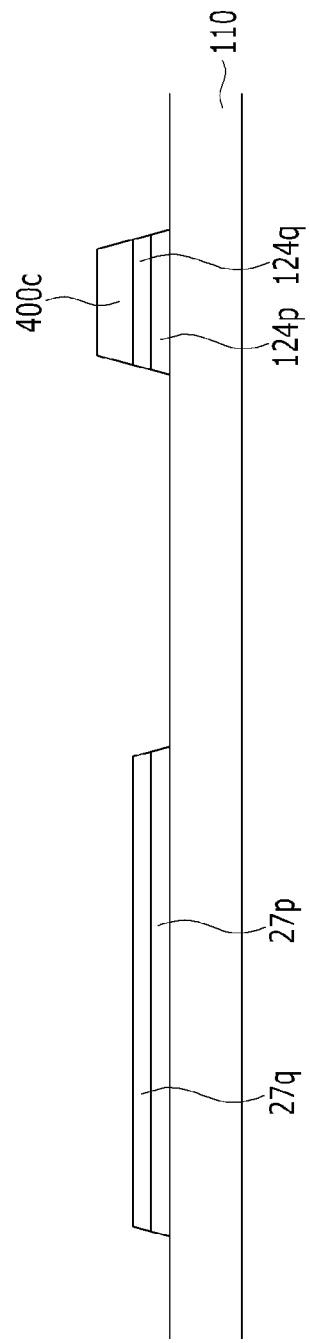
Figure 5E:
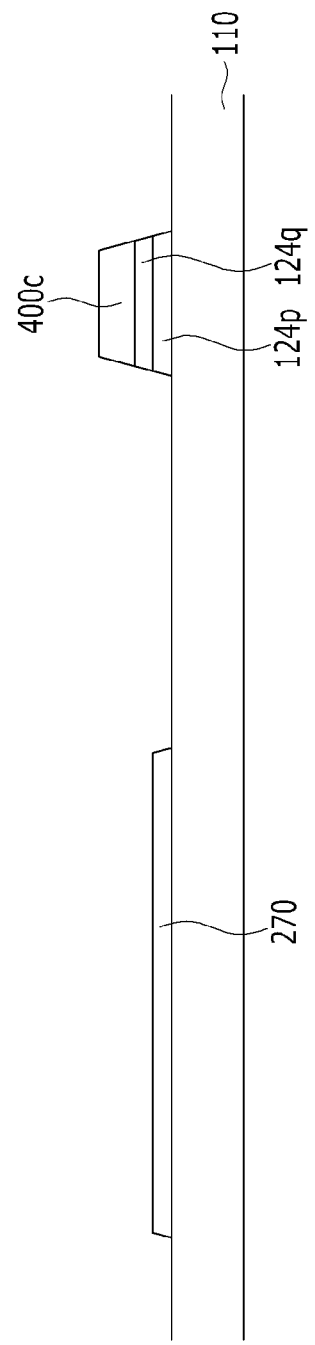
Figure 6:
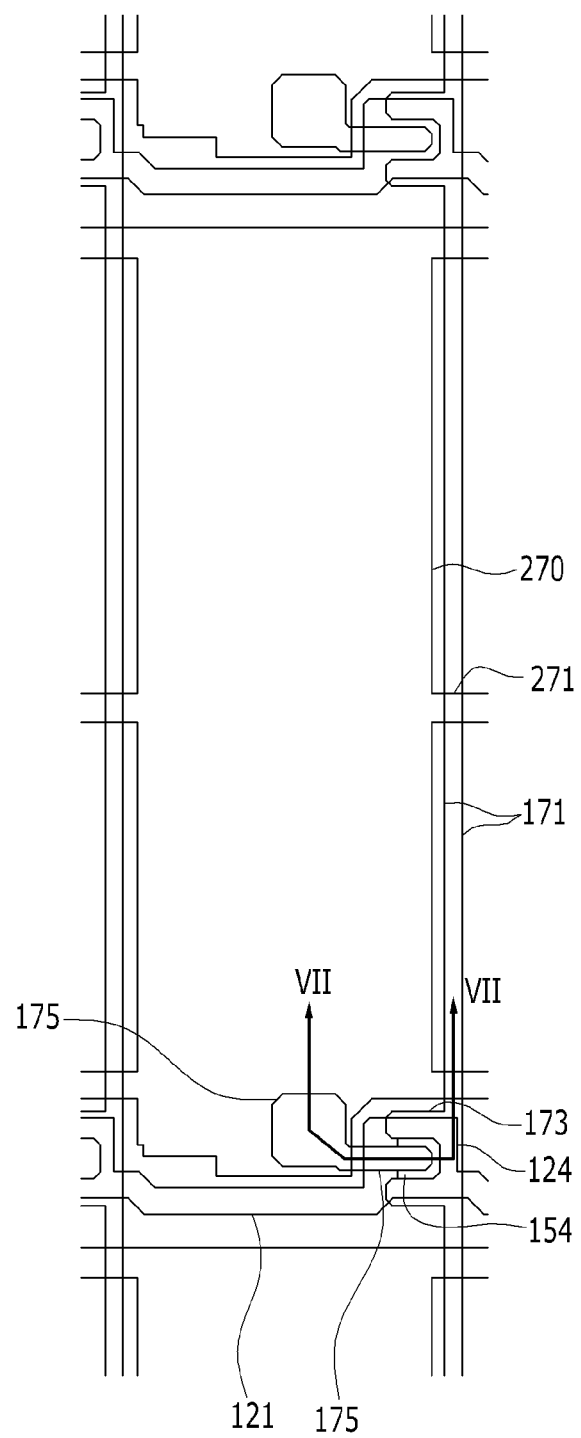
Figure 7:
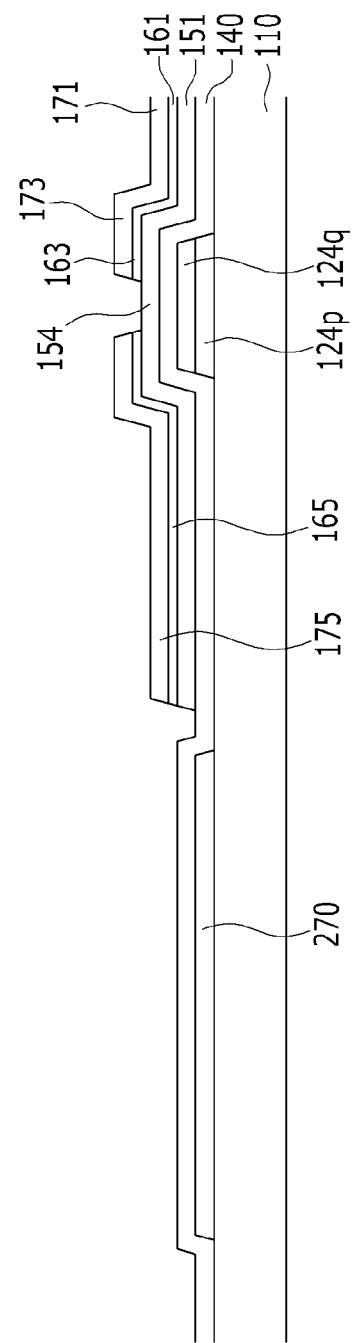
FIG. 7 is a cross-sectional view of the thin film transistor array panel of FIG. 6, taken along the line VII-VII.
Figure 8:
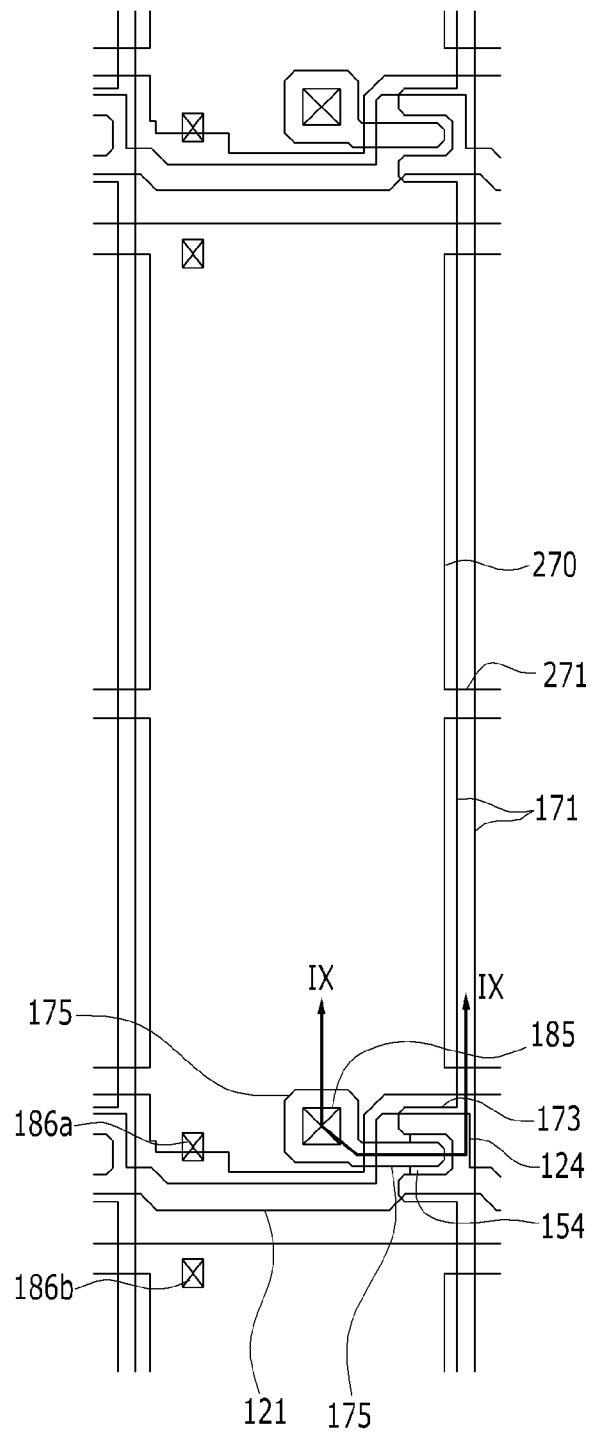
Figure 9:
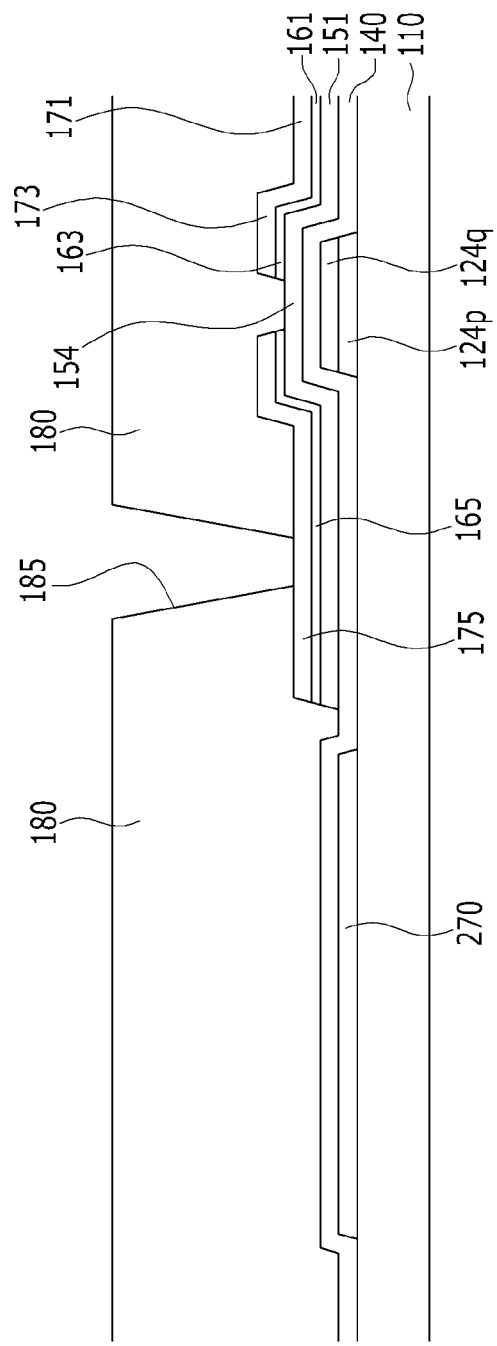
FIG. 9 is a cross-sectional view of the thin film transistor array panel of FIG. 8, taken along the line IX-IX.

FIG. 3, FIG. 6, and FIG. 8 are layout views sequentially showing a manufacturing method of a thin film transistor array panel, according to an exemplary embodiment of the present invention, FIG. 4 is a cross-sectional view of the thin film transistor array panel of FIG. 3, taken along the line IV-IV. FIG. 5A to FIG. 5E are cross-sectional views sequentially showing a manufacturing method of a thin film transistor array panel of FIG. 3 and FIG. 4. FIG. 7 is a cross-sectional view of the thin film transistor array panel of FIG. 6, taken along the line VII-VII. FIG. 9 is a cross-sectional view of the thin film transistor array panel of FIG. 8, taken along the line IX-IX.

Referring to FIG. 3 and FIG. 4, a gate conductor, including a gate line 121 and a gate electrode 124, and a reference electrode 270 are formed on an insulation substrate 110. In particular, as shown in FIG. 5A, a first conductive layer 101 and a second conductive layer 102 are sequentially deposited on the substrate 110, and a first photosensitive film 400 is formed on the second conductive layer 102. Here, the first conductive layer 101 may be a transparent conductive layer, such as an ITO or IZO layer, and the second conductive layer 102 may include copper (Cu) or a copper alloy.

As shown in FIG. 5B, the first photosensitive film 400 is exposed and developed to form a first photosensitive film pattern 400a and a second photosensitive film pattern 400b. The first photosensitive film pattern 400a and the second photosensitive film pattern 400b may have different thicknesses. In detail, the thickness of the second photosensitive film pattern 400b may be about two times the thickness of the first photosensitive film pattern 400a. The first photosensitive film pattern 400a is disposed at a position where the reference electrode 270 will be formed. The second photosensitive film pattern 400b is disposed at a position where the gate conductor (121 and 124) will be formed.

Referring to FIG. 5C, the first conductive layer 101 and the second conductive layer 102 are simultaneously etched with the first etchant, using the first photosensitive film pattern 400a and the second photosensitive film pattern 400b as an etching mask, to form first dual layers 27p and 27q disposed at a position where the reference electrode 270 will be formed, and second dual layers 124p and 124q disposed at a position where the gate conductor will be formed. Here, the first etchant may be a non-peroxide (non-$H_2O_2$) etchant that simultaneously etches the first conductive layer 101 and the second conductive layer 102.

In detail, the first etchant may include ammonium persulfate (APS), nitric acid, ammonium fluoride (AF), aminotetrazole (ATZ), or fluoroboric acid (FBA). In this way, the first conductive layer 101 and the second conductive layer 102 are etched simultaneously, such that the manufacturing process may be simplified, as compared with a conventional manufacturing method, in which the second conductive layer 102 is etched and then the first conductive layer 101 is etched using a peroxide etchant.

Referring to FIG. 5D, the first photosensitive film pattern 400a may then be removed. Here, a portion of the second photosensitive film pattern 400b is also removed, such that the third photosensitive film pattern 400c having the reduced thickness is formed. In particular, an etch-back process may be performed to completely remove the thinner first photosensitive film pattern 400a and reduce the thickness of the second photosensitive film pattern 400b, thereby forming the third photosensitive film pattern 400c.

As shown in FIG. 5E, the upper layer 27q is etched using a third photosensitive film pattern 400c as an etching mask and a second etchant, to form the reference electrode 270. The second etchant may be a non-peroxide-based (non-$H_2O_2$) etchant that is selective to the second conductive layer 102. In detail, the second etchant may include ammonium persulfate (APS), nitric acid, aminotetrazole (ATZ), or ammonium acetate (AA).

As shown in FIG. 3 and FIG. 4, the third photosensitive film pattern 400c is removed to complete the gate conductor (121 and 124). As shown in FIG. 6 and FIG. 7, a gate insulating layer is deposited on the reference electrode 270 and the gate conductor (121 and 124). A semiconductor stripe 151, ohmic contacts 161 and 165, a data line 171, and a drain electrode 175 are simultaneously formed using one mask. Here, by varying the thickness of a photosensitive film, the semiconductor 151, the ohmic contacts 161 and 165, the data line 171, and the drain electrode 175 may be simultaneously formed using one mask.

There may be various methods for forming the photosensitive pattern, such that portions thereof have different thicknesses. For example, an exposure mask that includes a transparent area, a light blocking area, and a semi-transparent area may be used. The semi-transparent area includes a slit pattern, a lattice pattern, or a thin film having an intermediate transmittance or having an intermediate thickness. When the slit pattern is used, the width of the slits or the space between the slits is preferably smaller than the resolution of a light exposer used for photolithography. Another example includes using a re-flowable photosensitive film. That is, a thin portion if formed by making a photosensitive film flow into a region where the photosensitive film is not present, after forming the re-flowable photosensitive film with a general exposure mask having only a light transmitting area and a light blocking area.

The passivation layer 180, having contact holes 185, 186a, and 186b, is formed on the data line 171, the drain electrode 175, and the semiconductor 154. Finally, as shown in FIG. 1 and FIG. 2, the pixel electrodes 190 and the first contact assistants 196 are formed on the passivation layer 180.

As described above, the manufacturing method of the thin film transistor array panel, according to an exemplary embodiment of the present invention, may include simultaneously forming the reference electrode and the gate conductor using one exposure mask. When etching the reference electrode and the gate conductor using the non-peroxide-based etchant, the first conductive layer of the reference electrode layer and the lower layer of the gate conductor, and the second conductive layer of the upper layer of the gate conductor are simultaneously etched, or only one conductive layer is selectively etched. Thereby the manufacturing process may be simplified and the manufacturing costs may be reduced, as compared with the case that the second conductive layer and the first conductive layer are sequentially etched using a conventional peroxide-based etchant.

Figure 10:
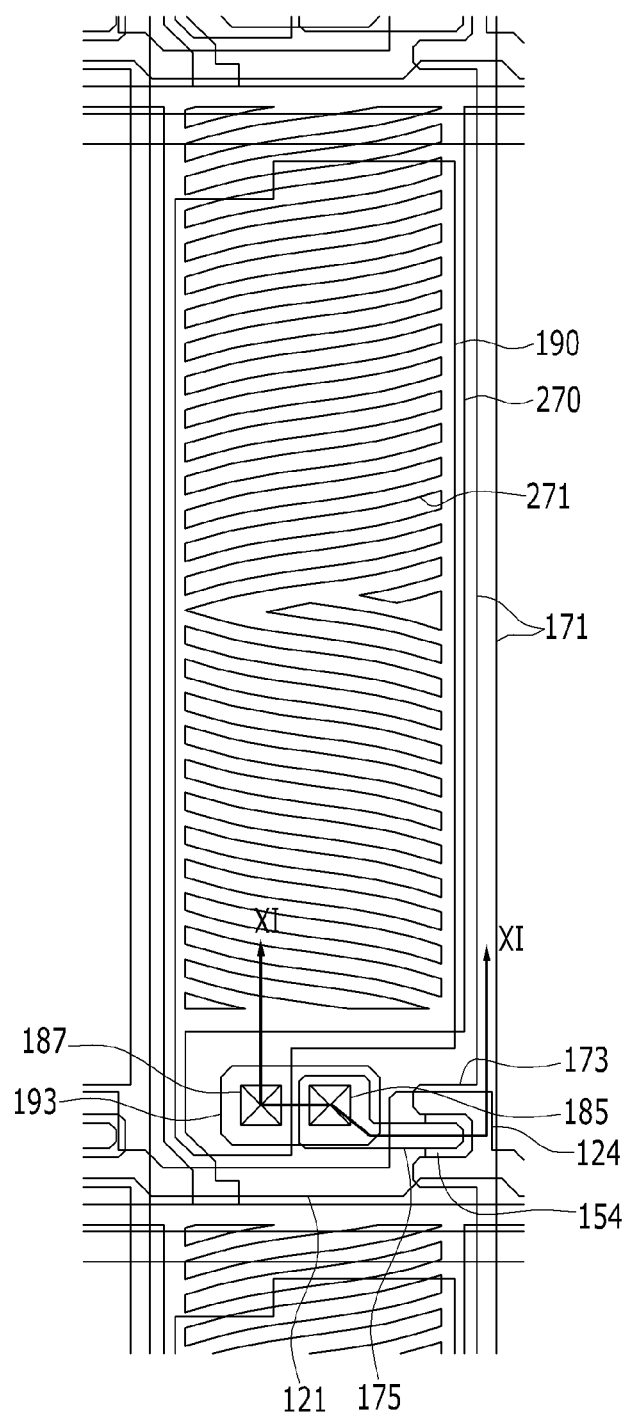
FIG. 10 is a layout view of a thin film transistor array panel, according to an exemplary embodiment of the present invention.
Figure 11:
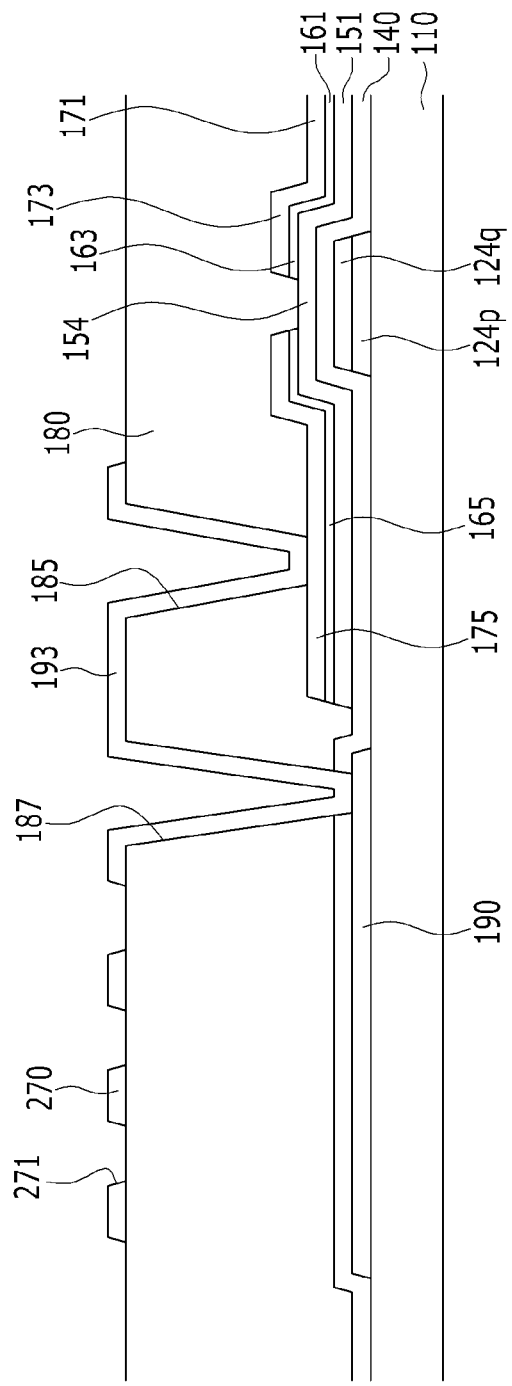
FIG. 11 is a cross-sectional view of the thin film transistor array panel of FIG. 10, taken along the line XI-XI.

FIG. 10 is a layout view of a thin film transistor array panel, according to an exemplary embodiment of the present invention. FIG. 11 is a cross-sectional view of the thin film transistor array panel of FIG. 10, taken along the line XI-XI. The layered structure of the thin film transistor array panel of FIG. 10 and FIG. 11 is similar to that of the thin film transistor array panel shown in FIG. 1 and FIG. 2. As such, only the differences therebetween will be described in detail.

Referring to FIG. 10 and FIG. 11, the thin film transistor array panel includes a gate conductor including a gate line 121 and a pixel electrode 190 formed on an insulation substrate 110. The pixel electrode 190 includes a plurality of branch electrodes 191. The pixel electrode 190 is planar and covers a pixel area.

The gate conductor (121 and 124) includes the lower layer 124p and the upper layer 124q. The lower layer 124p is formed on the same layer as the pixel electrode 190 and is made of the transparent conductive material. The upper layer 124q may be made of the metal having the low resistivity.

The gate conductor (121 and 124) and the pixel electrode 190 are simultaneously formed using one exposure mask. A gate insulating layer 140 made of silicon nitride ($SiN_x$) or silicon oxide ($SiO_x$) is formed on the gate conductor (121 and 124) and the pixel electrode 190.

A plurality of semiconductor stripes 151 made of hydrogenated amorphous silicon (a-Si) or polysilicon are formed on the gate insulating layer 140. The semiconductor stripes 151 mainly extend in a longitudinal direction and include a plurality of projections 154 that extend toward the gate electrode 124.

A plurality of ohmic contact stripes and islands 161 and 165 are formed on the semiconductor stripes 151. The ohmic contacts 161 and 165 may be made of a material such as n+ hydrogenated amorphous silicon, in which an n-type impurity such as phosphorus is doped at a high concentration, or may include a silicide. The ohmic contact stripes 161 have a plurality of projections 163. The projections 163 and the ohmic contact islands 165 are formed in pairs on the projections 154 of the semiconductor stripes 151.

A plurality of data lines 171 and a plurality of drain electrodes 175 are formed on the ohmic contacts 161 and 165. The data lines 171 transmit the data signals and mainly extend in the longitudinal direction, thereby intersecting the gate lines 121. Each data line 171 includes a plurality of source electrodes 173 that extend toward the gate electrode 124, and a wide end (not shown) for connecting to other layers or an external driving circuit.

The drain electrode 175 is separated from the data line 171 and faces the source electrode 173 with respect to the gate electrode 124. The drain electrode 175 includes a bar-shaped end portion and an extension having a wide area. The bar-shaped end portion is partially enclosed by the curved source electrode 173.

A passivation layer 180 is formed on the data lines 171, the drain electrodes 175, and the exposed portions of the semiconductor stripes 151. The passivation layer 180 has the first contact hole 185 exposing the drain electrode 175. The passivation layer 180 and the gate insulating layer 140 have a fourth contact hole 187 exposing a portion of the pixel electrode 190.

The reference electrode 270 and second contact assistants 193 are formed on the passivation layer 180. The reference electrode 270 includes a plurality of branch electrodes 271. The branch electrodes 191 extend approximately parallel to the gate line 121, and may be inclined with an angle of about 5° to about 20° with respect to the gate line 121. The second contact assistants 193 connect to the drain electrode 175 through the first contact hole and to the pixel electrode 190 through the fourth contact hole 187.

In contrast to the thin film transistor array panel shown in FIG. 1 and FIG. 2, the pixel electrode 190 is disposed on the same layer as the lower layer of the gate conductor (121 and 124) and is simultaneously formed with the gate conductor (121 and 124). In addition, the reference electrode 270 is formed on the passivation layer 180.

Figure 12:
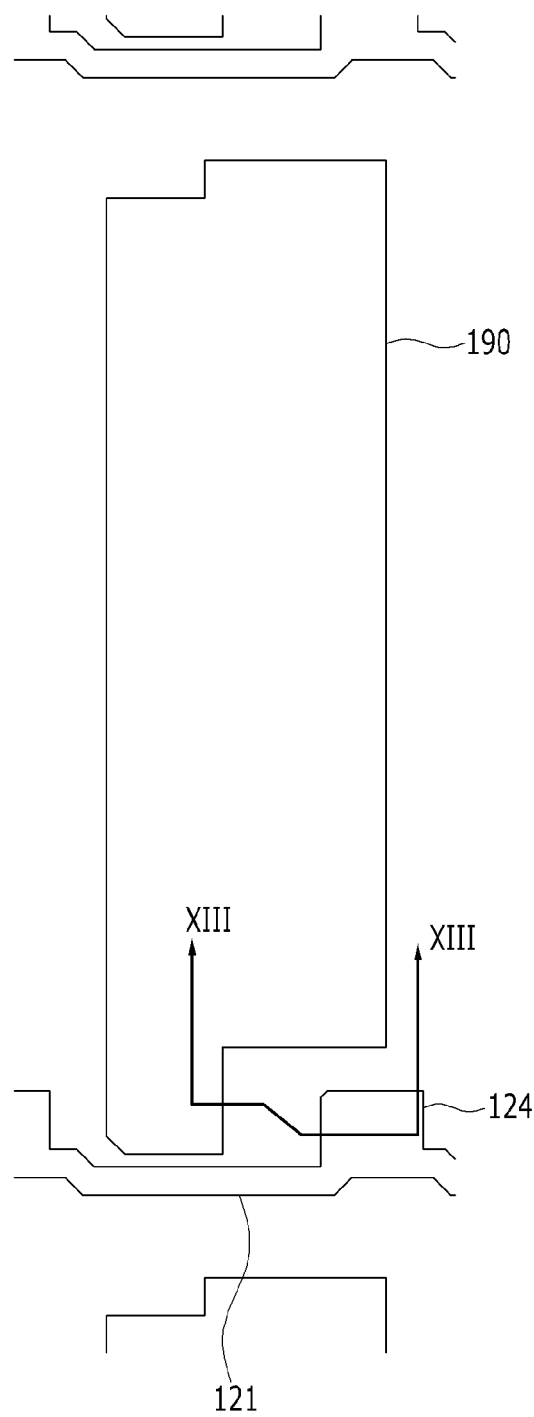
FIG. 12, FIG. 15, and FIG. 17 are layout views sequentially showing a manufacturing method of a thin film transistor array panel, according to an exemplary embodiment of the present invention.
Figure 13:
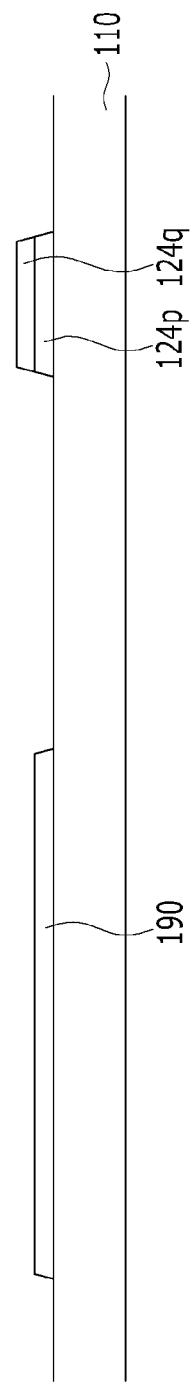
FIG. 13 is a cross-sectional view of the thin film transistor array panel of FIG. 12, taken along the line XIII-XIII.
Figure 14A:
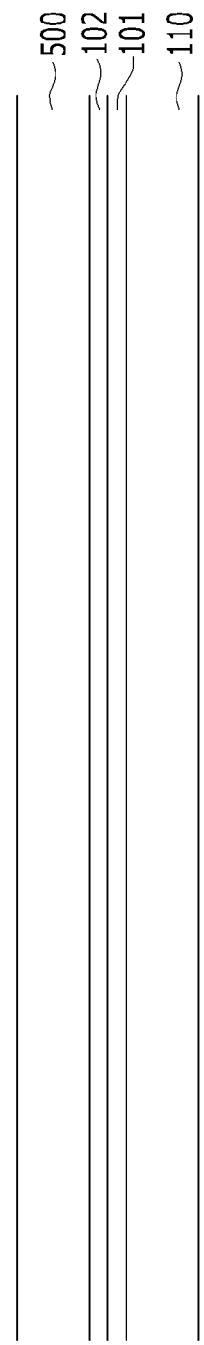
FIG. 14A to FIG. 14E are cross-sectional views sequentially showing a manufacturing method of a thin film transistor array panel shown in FIG. 12 and FIG. 13.
Figure 14B:
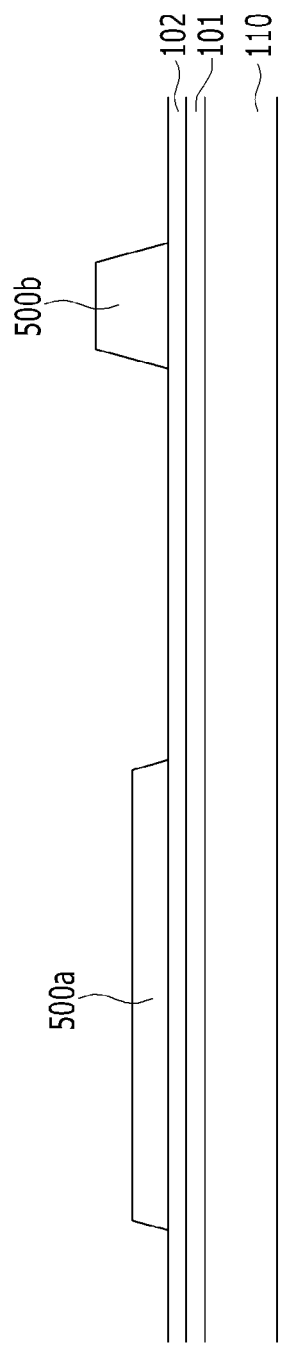
Figure 14C:
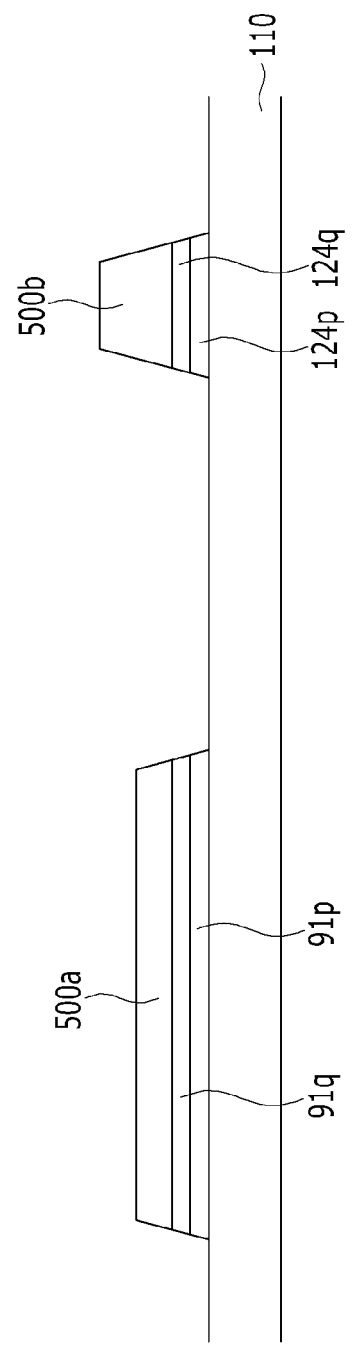
Figure 14D:
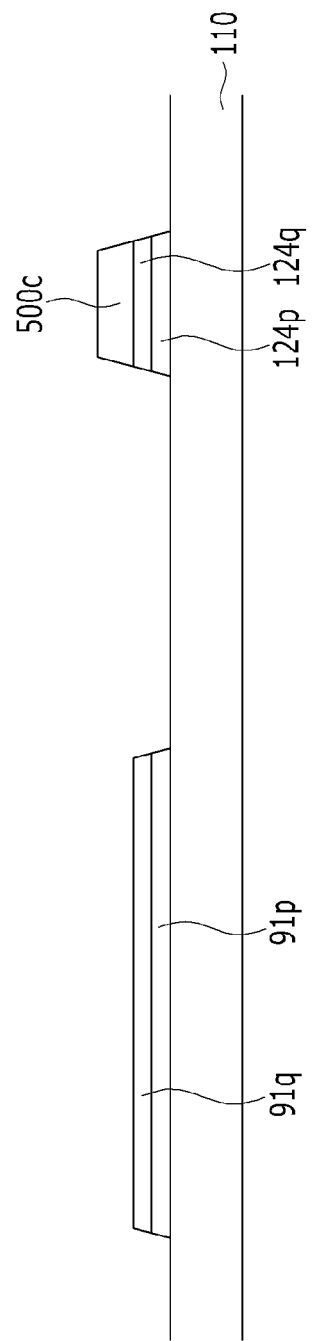
Figure 14E:
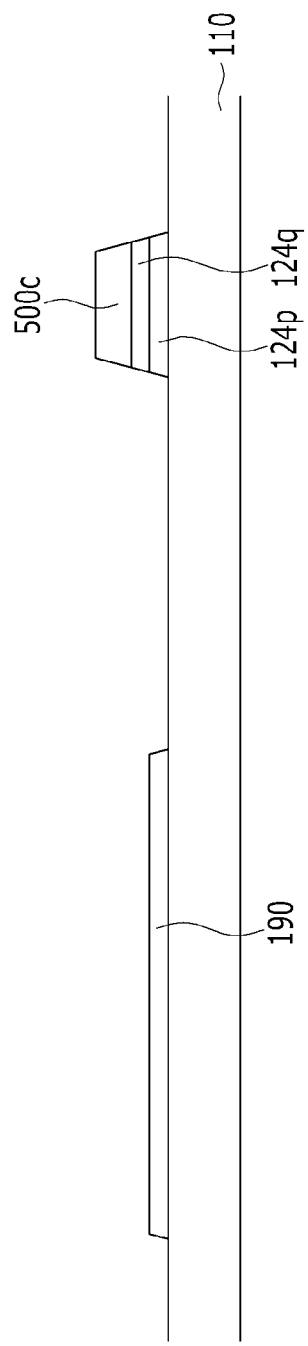
Figure 15:
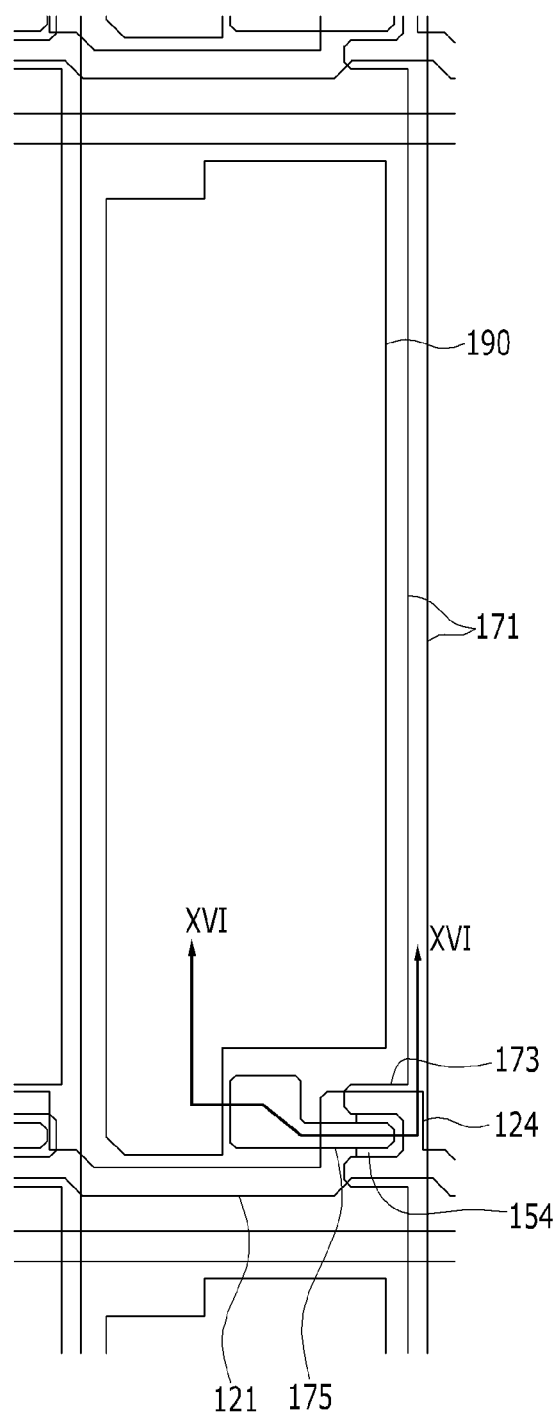
Figure 16:
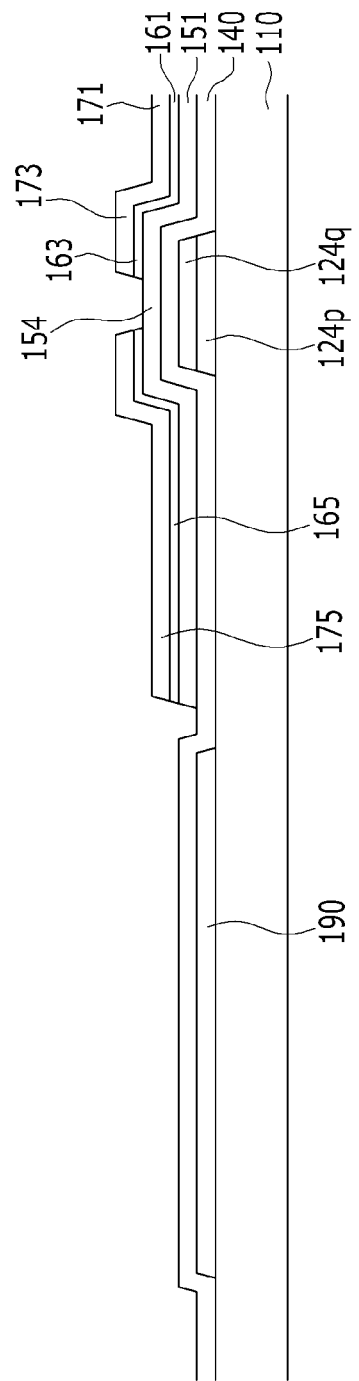
FIG. 16 is a cross-sectional view of the thin film transistor array panel of FIG. 15, taken along the line XVI-XVI.
Figure 17:
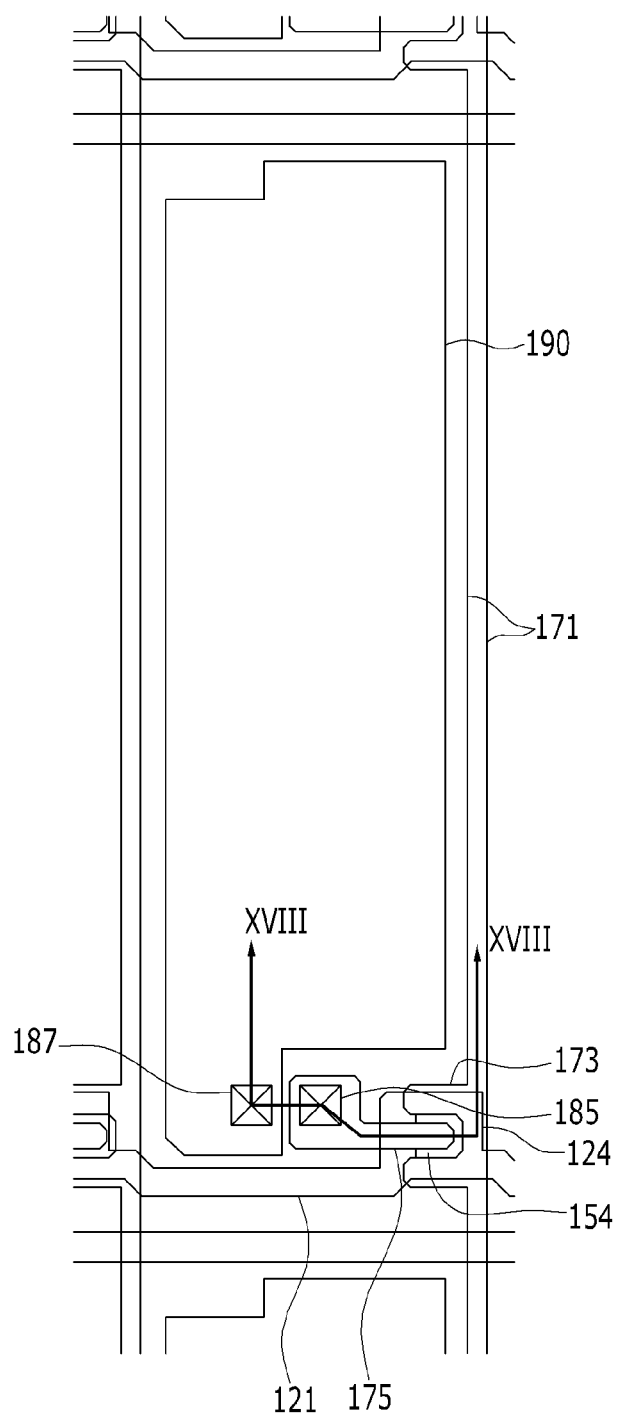
Figure 18:
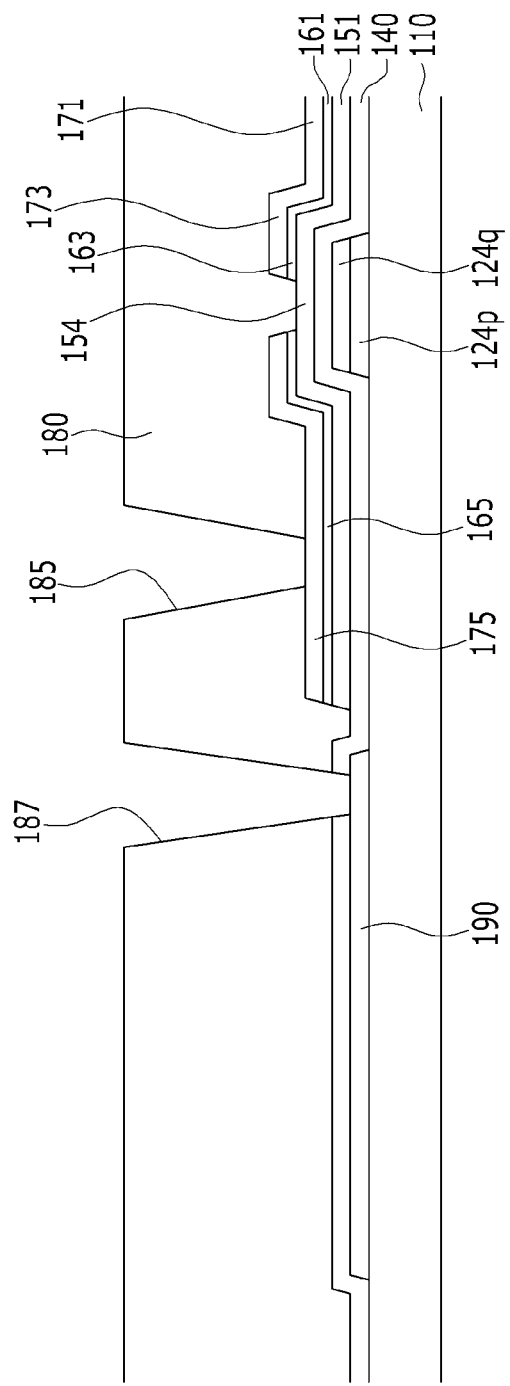
FIG. 18 is a cross-sectional view of the thin film transistor array panel of FIG. 17, taken along the line XVIII-XVIII.

FIG. 12, FIG. 15, and FIG. 17 are layout views sequentially showing a manufacturing method of a thin film transistor array panel, according to an exemplary embodiment of the present invention. FIG. 13 is a cross-sectional view of the thin film transistor array panel of FIG. 12, taken along the line XIII-XIII. FIG. 14A to FIG. 14E are cross-sectional views sequentially showing a manufacturing method of a thin film transistor array panel of FIG. 12 and FIG. 13. FIG. 16 is a cross-sectional view of the thin film transistor array panel of FIG. 15, taken along the line XVI-XVI. FIG. 18 is a cross-sectional view of the thin film transistor array panel of FIG. 17, taken along the line XVIII-XVIII.

Referring to FIG. 12 and FIG. 13, a gate conductor, including a gate line 121 and a gate electrode 124, and a pixel electrode 190 are formed on an insulation substrate 110. As shown in FIG. 14A, a first conductive layer 101 and a second conductive layer 102 are sequentially deposited on a substrate 110, and a second photosensitive film 500 is formed on the second conductive layer 102. Here, the first conductive layer 101 may be the transparent conductive layer, such as ITO or IZO, and the second conductive layer 102 may include copper (Cu) or a copper alloy.

As shown in FIG. 14B, the second photosensitive film 500 is exposed and developed to form a fourth photosensitive film pattern 500a and a fifth photosensitive film pattern 500b. The fourth photosensitive film pattern 500a and the fifth photosensitive film pattern 500b may have different thicknesses. In detail, the thickness of the fifth photosensitive film pattern 500b may be about two times the thickness of the fourth photosensitive film pattern 500a. The fourth photosensitive film pattern 500a is disposed at a position where the pixel electrode 190 will be formed, and the fifth photosensitive film pattern 500b is disposed at a position where the gate conductor (121 and 124) will be formed.

Referring to FIG. 14C, the first conductive layer 101 and the second conductive layer 102 are simultaneously etched using the fourth photosensitive film pattern 500a and the fifth photosensitive film pattern 500b as an etching mask and by using the first etchant, to form third dual layers 91p and 91q disposed at the position where the pixel electrode 190 will be formed, and the second dual layers 24p and 24q disposed at the position where the gate conductor will be formed. Here, the first etchant may simultaneously etch the first conductive layer 101 and the second conductive layer 102.

As such, the first conductive layer 101 and the second conductive layer 102 are both etched using the first etchant, such that the manufacturing process may be simplified, as compared with a conventional manufacturing method, in which the second conductive layer 102 is etched and then the first conductive layer 101 is etched using a peroxide etchant.

Referring to FIG. 14D, the fourth photosensitive film pattern 500a may be removed. A portion of the fifth photosensitive film pattern 500b is also removed, such that a sixth photosensitive film pattern 500c having a reduced thickness is formed. This operation may be conducted using an etch-back process.

As shown in FIG. 14E, the upper layer 91q is etched with the second etchant, using the sixth photosensitive film pattern 500c as an etching mask, to form the pixel electrode 190. Here, the second etchant may selectively etch only the second conductive layer 102.

As shown in FIG. 12 and FIG. 13, the sixth photosensitive film pattern 500c is removed to complete the gate conductor (121 and 124). As shown in FIG. 14 and FIG. 15, a gate insulating layer is deposited on the pixel electrode 190 and the gate conductor (121 and 124). A semiconductor 151, ohmic contacts 161 and 165, a data line 171, and a drain electrode 175 are simultaneously formed, using one mask disposed thereon. By varying the thickness of a photosensitive film, the semiconductor 151, the ohmic contacts 161 and 165, the data line 171, and the drain electrode 175 may be simultaneously formed using one mask.

Next, a passivation layer 180 having contact holes 185 and 187 is formed on the data line 171, the drain electrode 175, and the exposed semiconductor 154. Finally, as shown in FIG. 10 and FIG. 11, the reference electrode 270 and the second contact assistants 193 are formed on the passivation layer 180.

As described above, the manufacturing methods according to various embodiments may simultaneously form the pixel electrode and the gate conductor using one exposure mask. When etching the pixel electrode and the gate conductor using the non-peroxide-based etchant, the first conductive layer of the pixel electrode layer and the lower layer of the gate conductor, and the second conductive layer of the upper layer of the gate conductor are simultaneously etched, or only one conductive layer is selectively etched. As such, the manufacturing process may be simplified and the manufacturing costs may be reduced, as compared with conventional methods It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array panel comprising:
   a substrate;
   a gate conductor comprising a lower layer disposed on the substrate and an upper layer disposed on the lower layer;
   a first electrode disposed on the substrate;
   a gate insulating layer disposed on the gate conductor and the first electrode;
   a semiconductor disposed on the gate insulating layer;
   a source electrode and a drain electrode disposed on the semiconductor;
   a passivation layer disposed on the source electrode and the drain electrode; and
   a second electrode disposed on the passivation layer,
   wherein, the lower layer of the gate conductor and the first electrode are disposed directly on the same layer and comprise the same type of material, and
   wherein the lower layer of the gate conductor and the first electrode comprise indium tin oxide (ITO) or indium zinc oxide (IZO), and
   wherein the upper layer of the gate conductor comprises copper or a copper alloy.

2. The thin film transistor array panel of claim 1, wherein the first electrode is a reference electrode and the second electrode is a pixel electrode.

3. The thin film transistor array panel of claim 1, wherein:
   the first electrode covers a pixel area of a substrate; and
   the first electrode comprises two or more connections that extend from the first electrode to a first electrode of an adjacent pixel area.

4. The thin film transistor array panel of claim 1, wherein the first electrode covers substantially all of a pixel area of a substrate.

5. A thin film transistor array panel comprising:
   a substrate;
   a gate conductor comprising a lower layer disposed on the substrate and an upper layer disposed on the lower layer;
   a pixel electrode disposed on the substrate;
   a gate insulating layer disposed on the gate conductor and the pixel electrode;
   a semiconductor disposed on the gate insulating layer;
   a source electrode and a drain electrode disposed on the semiconductor;
   a passivation layer disposed on the source electrode and the drain electrode; and
   a reference electrode disposed on the passivation layer,
   wherein, the lower layer of the gate conductor and the pixel electrode are disposed directly on the same layer and comprise the same type of material.

6. The thin film transistor array panel of claim 5, wherein the upper layer of the gate conductor comprises copper or a copper alloy.

7. The thin film transistor array panel of claim 6, wherein the lower layer of the gate conductor and the pixel electrode comprise indium tin oxide (ITO) or indium.

* * * * *